(12) United States Patent
Yoshihara et al.

(10) Patent No.: US 7,005,715 B2
(45) Date of Patent: *Feb. 28, 2006

(54) MAGNETIC STORAGE DEVICE AND METHOD OF FABRICATING THE SAME

(75) Inventors: Ikuo Yoshihara, Kanagawa (JP); Makoto Motoyoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/112,372

(22) Filed: Apr. 22, 2005

(65) Prior Publication Data

US 2005/0185435 A1    Aug. 25, 2005

Related U.S. Application Data

(63) Continuation of application No. 10/472,116, filed on Sep. 19, 2003.

(30) Foreign Application Priority Data

Jan. 21, 2002    (JP)    ............................... 2002-10983

(51) Int. Cl.
*H01L 29/76*    (2006.01)
(52) U.S. Cl. ........................ 257/390; 257/421; 257/427
(58) Field of Classification Search ................ 257/295, 257/368, 390, 414, 421, 427
See application file for complete search history.

(56) References Cited

U.S. PATENT DOCUMENTS 4,970,564 A    11/1990    Kimura

| | | | |
|---|---|---|---|
| 5,640,343 A * | 6/1997 | Gallagher et al. .......... 365/171 |
| 6,392,924 B1 | 5/2002 | Liu et al. |
| 6,522,574 B1 | 2/2003 | Li et al. |
| 6,653,703 B1 | 11/2003 | Hosotani et al. |
| 6,744,651 B1 | 6/2004 | Tang |
| 6,771,533 B1 | 8/2004 | Witcraft et al. |
| 6,881,994 B1 * | 4/2005 | Lee et al. .................... 257/296 |

FOREIGN PATENT DOCUMENTS

| JP | 2000-331473 | 11/2000 |
|---|---|---|
| JP | 2002-319664 | 10/2002 |

* cited by examiner

*Primary Examiner*—Tuan H. Nguyen
(74) *Attorney, Agent, or Firm*—Sonnenschein, Nath & Rosenthal LLP

(57) ABSTRACT

Problems in reliability and cross-talk of MRAM, which are intrinsically ascribable to the structure thereof, are solved at the same time. In a magnetic storage device (1) having write word lines (11) and bit lines (12) formed so as to cross while keeping a predetermined space therebetween, and provided with a TMR element (13) configured so as to sandwich a tunnel insulating layer (303) with a magnetization fixed layer (302) and a storage layer (304) comprising a ferromagnetic layer, in each of thus-formed intersectional region, and there is provided a semiconductor region (22) in which two read transistors (24, 24), which serve as read transistors, are formed, and which comprises a first region (22a) obliquely crosses a projected region of the write word line (11); a second region (22b) formed in parallel with the bit line (12) so as to be continued from one end of the first region; and a third region (22c) formed in parallel with the bit line (12) and so as to be continued from the other end of the first region (22a).

1 Claim, 11 Drawing Sheets

(a)

(b)

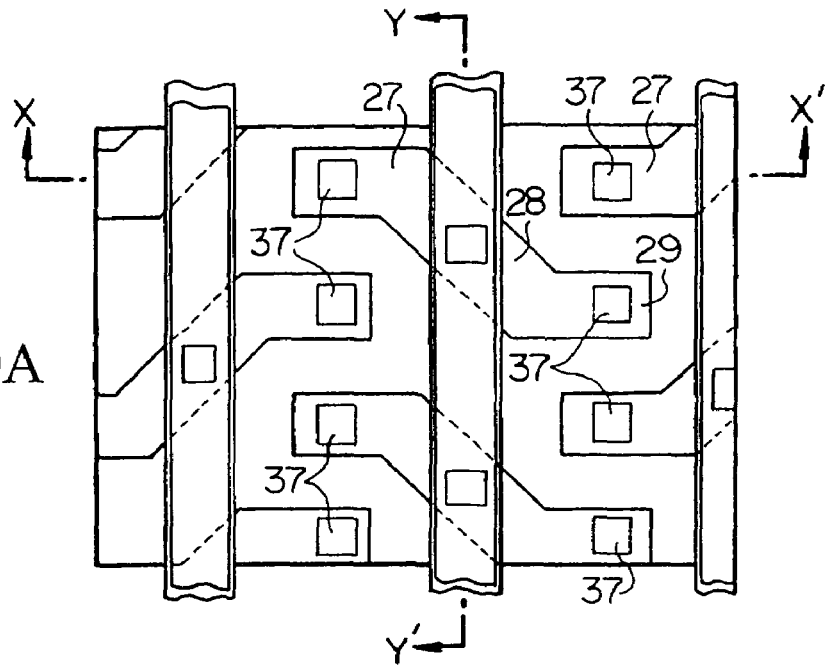
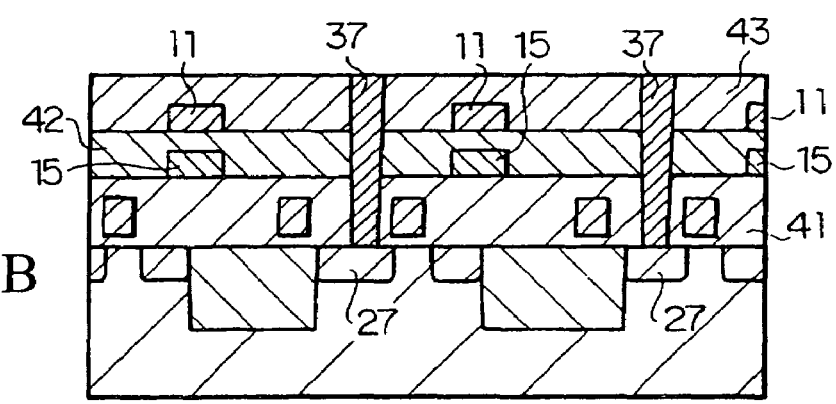
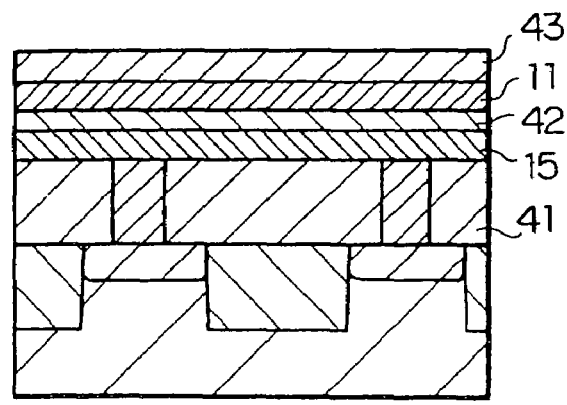
Fig.10A
Fig.10B
Fig.10C

MAGNETIC STORAGE DEVICE AND METHOD OF FABRICATING THE SAME

RELATED APPLICATION DATA

This application is a continuation application of U.S. application Ser. No. 10/472,116, filed Sep. 19, 2003, which claims priority to Japanese Application No. 2002-10983 filed Jan. 21, 2002, which application is incorporated herein by reference to the extent permitted by law.

TECHNICAL FIELD

The present invention relates to a magnetic storage device and a method of fabricating the same, and more specifically to a non-volatile magnetic storage device configured so as to store information in response to changes in resistance value depending on parallel or antiparallel alignment of spin of a ferromagnetic material composing a tunnel magnetoresistance element, and a method of fabricating the same.

BACKGROUND ART

With a dramatic popularization of information communication instruments in particular of mobile terminals, there are increasing demands for further advanced performances of elements such as memory elements and logic elements, with regard to higher degree of integration, higher speed, and lower power consumption. In particular, non-volatile memory is considered as an indispensable element in the ubiquitous era.

For example, non-volatile memory can protect important personal information even when exhaustion or any troubles occurred in power supply, or when a server and a network were disconnected due to some failure. Upgrading of the degree of integration or capacity of the non-volatile memory are thus increasingly adds its importance as a technology for providing alternatives for hard disks and optical disks which cannot be downsized by nature due to involvement of movable sections.

Meanwhile, recent mobile instruments are designed so as to suppress power consumption as possible by bringing unnecessary circuit blocks into stand-by status, but realization of a non-volatile memory capable of working both as a high-speed network memory and a high-capacity storage memory can expel any waste in power consumption and memory. So-called "Instant-On" function, which enables instantaneous activation upon power ON, can also be realized if the high-speed, large-capacity, non-volatile memory comes true.

Known non-volatile memories include flash memory using semiconductor, and FRAM (ferroelectric random access memory) using ferroelectric material. The flash memory, however, suffers from a problem that it is hard to be integrated to a large degree due to its complicated structure, and that it has only a write speed as slow as having an order of microsecond. It has also been pointed out as for FRAM that it has a number of times of rewriting of only as small as $10^{12}$ to $10^{14}$ times, indicating that it is too less durable to completely replace a static random access memory or a dynamic random access memory. Difficulty in microprocessing of the ferroelectric capacitor is also pointed out as a problem.

What is attracting a public attention as non-volatile memories free from these drawbacks is magnetic memory which is called as MRAM (Magnetic Random Access Memory) or simply as MR (Magneto resistance) memory, as described by Wang et al. in IEEE Trans. Magn., 33 (1997), p. 4498, which is becoming more focused with progress in characteristics of TMR (Tunnel Magnetoresistance) material.

MRAM can easily be increased in the degree of integration by virtue of its simple structure, and is expected to be increased in the number of times of rewriting because the recording is based on rotation of magnetic moment. The access speed thereof is also expected to be very rapid, and R. Scheuerlein et al. have already reported in ISSCC Digest of Papers (February 2000), p. 128–129 that it was operable at 100 MHz.

Recording in MRAM is made effective based on rotation of a current magnetic field in a recording layer induced by current supplied to the wirings. Higher integration and consequently thinned wirings, however, inevitably reduce critical current value allowable by a write line to thereby weaken an obtainable magnetic field, and this unwillingly decreases coercive force of a recordable region. This means decrease in reliability of the information recording element. Moreover, a magnetic field cannot be condensed unlike light or electron beam, and this may possibly be a major cause for cross-talk in a case of a highly-integrated element.

To solve these problems in the reliability and cross-talk at the same time, it is essential, even under a highly integrated status, to ensure a sufficient width both for bit lines and write word lines crossing at a right angle to each other, both of which are magnetic field applying means for applying a magnetic field to ferromagnetic tunnel junction, where an optimum shield structure for suppressing a leakage magnetic field becomes also necessary.

A subject to be solved by the present invention therefore is to solve problems in reliability and cross-talk of MRAM, which are intrinsically ascribable to the structure thereof, at the same time.

DISCLOSURE OF THE INVENTION

The present invention relates to a magnetic storage device and a method of fabricating the same conceived to solve the aforementioned subject.

The magnetic storage device of the present invention is such as comprising a write word line; a bit line formed so as to cross the write word line while keeping a predetermined space therebetween; a magnetic storage element composed so that a tunnel insulating film is sandwiched by ferromagnetic material layers, and disposed at an intersectional region of the write word line and the bit line; and a connection layer containing an antiferromagnetic material layer formed on the write word line side of the magnetic storage element, characterized in having a semiconductor region in which two read transistors are formed, and which comprises a first region obliquely crosses a projected region of the write word line; a second region formed in parallel with the bit line so as to be continued from one end of the first region; and a third region formed in parallel with the bit line so as to be continued from the other end of the first region.

In the above-described semiconductor magnetic storage device, because the semiconductor region in which two read transistors are formed comprises the first region obliquely crosses a projected region of the write word line; the second region formed in parallel with the bit line so as to be continued from one end of the first region; and the third region formed in parallel with the bit line so as to be continued from the other end of the first region, storage cells which individually comprise the magnetic storage element and connection layer can be arranged to be shifted by ½n (where, n represents a natural number of 1 or larger) pitches in an oblique direction away from the extending direction of the write word line, even when the cell is designed so that the magnetic storage element is arranged in the intersectional region of the bit line and write word line, and so that the connection layer is connected to the end portion of the semiconductor region.

Moreover, one end portion of each of a plurality of semiconductor regions which compose a second semiconductor region array adjacent to a first semiconductor region array comprising a plurality of the semiconductor regions arranged in the extending direction of the write word line can be arranged one by one between the individual semiconductor regions in the first semiconductor region array on the second semiconductor region array side.

Accordingly, this makes it possible to isolate the semiconductor regions in which the read transistors are to be made, using the element isolation regions in an effective manner, while avoiding waste in terms of occupied area. It is also made possible to reduce contact holes for connecting the diffusion layers of the read transistors and the bit lines without causing short-circuiting of the individual semiconductor regions, and this makes it possible to avoid short-circuiting between the semiconductor regions even if the storage cells are further down-sized as compared with the contact holes.

The method of fabricating a semiconductor magnetic storage device of the present invention is such as fabricating an information storage device comprising magnetic storage devices each of which having a tunnel magnetoresistance element composed so that a tunnel insulating layer is sandwiched by ferromagnetic layers, disposed at an intersectional region of a write word line and a bit line which cross with each other while keeping a predetermined space therebetween, and configured so as to store information in response to changes in the resistivity depending on parallel or antiparallel alignment of spin of the ferromagnetic material layer; characterized in having a step of forming an element isolation region for partitioning a semiconductor region in which two read transistors are formed, and comprises a first region obliquely crosses a projected region of an expected region in which the write word line will be formed later; a second region formed in parallel with the bit line so as to be continued from one end of the first region; and a third region formed in parallel with the bit line so as to be continued from the other end of the first region; a step of forming gate electrodes on the semiconductor region in parallel with the expected region in which the write word line will be formed later while placing a gate insulating film in between, and of forming a pair of diffusion layers in the semiconductor region on both sides of the gate electrodes so that the first region of the semiconductor region can serve as a common diffusion layer, to thereby configure two read transistors; a step of forming a first insulating film so as to cover the two read transistors; a step of forming a power supply line so as to be connected with the common diffusion layer for the two read transistors, and in parallel with the expected region in which the write word line will be formed later; a step of forming a second insulating film so as to cover the power supply line; a step of forming, on the second insulating film, the write word line for applying magnetic field to the magnetic storage element; a step of forming a third insulating film so as to cover the write word line; a step of forming contact portions penetrating the third insulating film through the first insulating film, so as to be connected to each of two diffusion layers other than the common diffusion layer composing the two read transistors; a step of forming, on the third insulating film, a connection layer including antiferromagnetic material layer so as to be connected to each of the contact portions, and of forming a magnetic storage element having a ferromagnetic tunnel junction composed so that a tunnel insulating film is sandwiched by ferromagnetic layers; a step of forming a fourth insulating film so as to cover the magnetic storage element; and a step of forming, on the fourth insulating film, a bit line so as to be connected to the magnetic storage element, and so as to cross at a right angle to the write word line.

In the method of fabricating a magnetic storage device of the present invention, because the semiconductor region in which two read transistors are formed comprises the first region obliquely crosses a projected region of the write word line; the second region formed in parallel with the bit line so as to be continued from one end of the first region; and the third region formed in parallel with the bit line so as to be continued from the other end of the first region, storage cells which individually comprise the magnetic storage element and connection layer can be arranged so as to be shifted by ½n (where, n represents a natural number of 1 or larger) pitches in an oblique direction away from the extending direction of the write word line, even when the cell is designed so that the magnetic storage element is arranged in the intersectional region of the bit line and write word line, and so that the connection layer is connected to the end portion of the semiconductor region.

Moreover, one end portion of each of a plurality of semiconductor regions which compose a second semiconductor region array adjacent to a first semiconductor region array comprising a plurality of the semiconductor regions arranged in the extending direction of the write word line can be arranged one by one between the individual semiconductor regions in the first semiconductor region array on the second semiconductor region array side. This makes it possible to effectively layout the semiconductor regions in which the read transistors are to be made while avoiding waste in terms of occupied area.

This also solves the problem of cross-talk because distance between the individual magnetic storage elements and distance between the individual write word lines can be ensured to a sufficient degree.

BRIEF DESCRIPTION OF THE DRAWINGS

FIGS. 10A to 10C are schematic structural sectional views and a layout diagram of one embodiment related to the method of fabricating the magnetic storage device of the present invention.

BEST MODES FOR CARRYING OUT THE INVENTION

Figure 3:
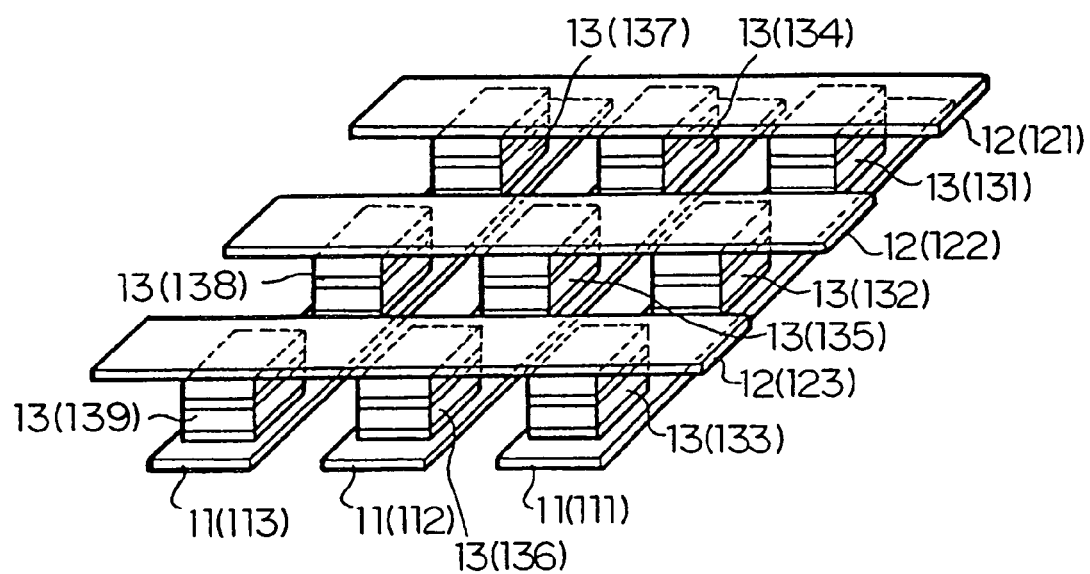
FIG. 3 is a schematic structural perspective view of an essential portion of an MRAM in a simplified manner.

First, a general MRAM (Magnetic Random Access Memory) will be explained referring to FIG. 3 which is a schematic structural perspective view showing an essential portion thereof in a simplified manner. In FIG. 3, illustration of the read-out circuit portion is omitted for simplicity.

It includes nine memory cells, as can be seen in FIG. 3, where write word lines 11 (111, 112, 113) and bit lines 12 (121, 122, 123) are disposed so as to cross with each other. At intersectional regions of the write word lines 11 and the bit lines 12, magnetoresistance effect (TMR) elements 13 (131 to 139) are disposed as magnetic storage elements. Write operation to the TMR elements 13 are accomplished by allowing electric current to flow in the bit lines 12 and the write word lines 11, and changing the direction of magnetization of the storage layer 304 (see FIG. 6 for detail) of the TMR elements 13, formed at the intersections between the bit lines 12 and the write word lines 11, into parallel or antiparallel with respect to a magnetization fixed layer 302 (see FIG. 6 for detail) in response to a synthetic magnetic field created by the lines.

Figure 4:
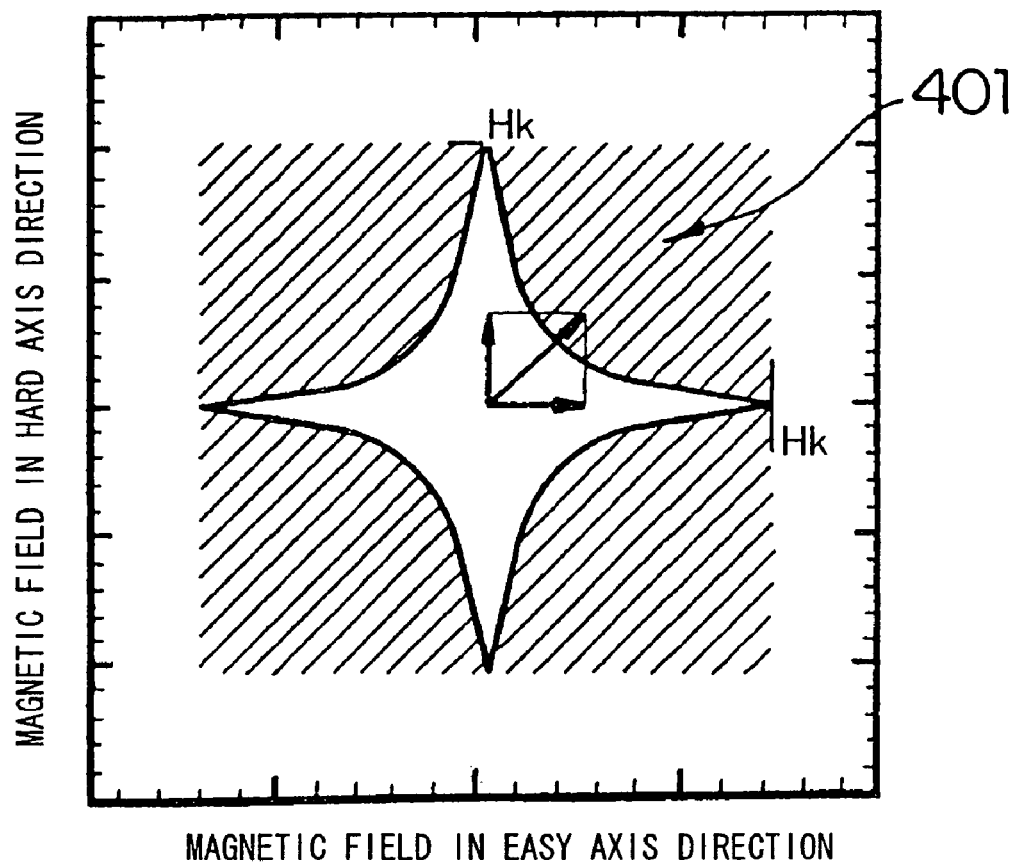
FIG. 4 is an asteroid curve showing an inversion threshold value in a direction of magnetization of a storage layer affected by a magnetic field in an easy axis direction $H_{EA}$ and a magnetic field in a hard axis direction $H_{HA}$.

The asteroid curve shown in FIG. 4 shows inversion threshold value in a direction of magnetization of a storage layer affected by a magnetic field in the easy axis direction $H_{EA}$ and a magnetic field in the hard axis direction $H_{HA}$. The magnetic field will invert when any synthetic magnetic field vector which falls in the area outside the asteroid curve occurs. A synthetic magnetic field vector which falls within the asteroid curve will never result in inversion of the cell from either one of the current bistable statuses. In addition, because also the cells, other than those at the intersections where both of word lines and bit lines are supplied with electric current, are applied with the magnetic field generated solely by the word lines or bit lines, and because also the cells other than those in the intersections will cause inversion of the magnetization direction, if intensity of the magnetic field exceeds a unidirectional inversion magnetic field $H_K$, selective writing to the selected cells is available only when the synthetic magnetic field falls within a hatched region 401.

As has been described in the above, memory cells in the MRAM array are arranged at the intersections of a grid composed of the bit lines and write word lines. It is a general practice for MRAM to enable selective write operation to the individual memory cells based on magnetic inversion property by using the write word lines and bit lines.

Synthetic magnetization at a single storage region can be determined by vector synthesis of a magnetic field in the easy axis direction ($H_{EA}$) and a magnetic field in the hard axis direction ($H_{HA}$) applied thereto. Electric current flowing in the bit line applies the magnetic field in the easy axis direction ($H_{EA}$) to the cell, and electric current flowing in the write word line applies the magnetic field in the hard axis direction ($H_{HA}$).

Documents (R. H. Koch et al., Phys. Rev. Lett. 84 (2000), p. 5419; and J. Z. Sun et al., Joint Magnetism and Magnetic Material 8 (2001)) disclose that "assistance of magnetic inversion by elevating temperature can successfully lower the inversion magnetic field $H_{SW}$ in the hard axis direction". Therefore also for the magnetic storage device of the present invention, it is effective to elevate the temperature to a degree not adversely affective to the elements.

Next, a principle circuit of the MRAM explained in the above referring to FIG. 3 will be explained referring to a circuit diagram in FIG. 5.

Figure 5:
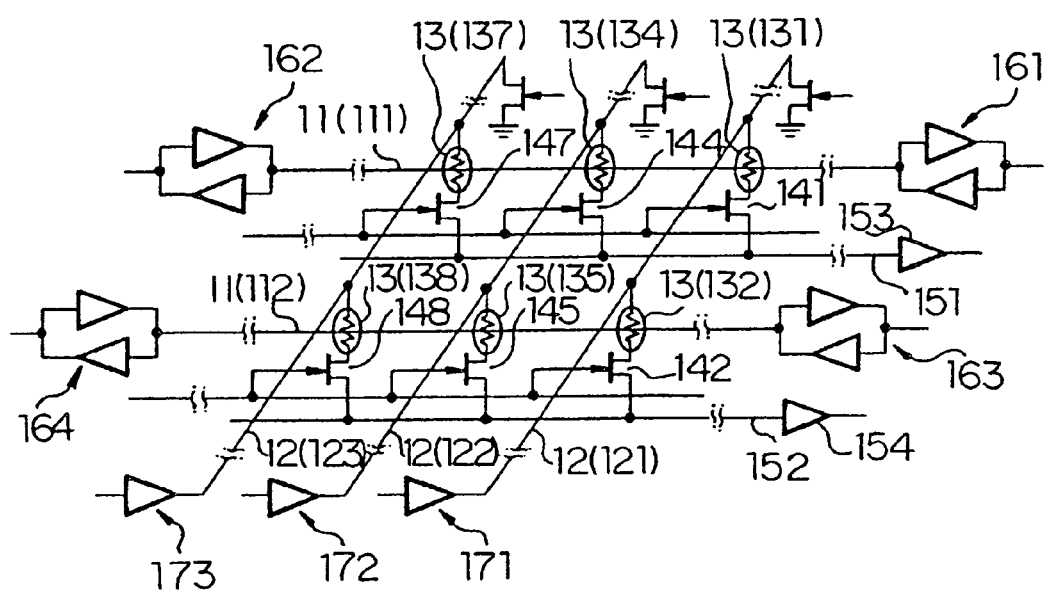
FIG. 5 is a circuit diagram showing a principle circuit of the MRAM shown in FIG. 3.

As shown in FIG. 5, the MRAM circuit includes six memory cells, and has write word lines 11 (111,112) and bit lines 12 (121,122,123), which correspond to those shown in FIG. 3, crossing with each other. At the intersections of the write word lines 11 and the bit lines 12, TMR elements 13 (131, 132, 134, 135, 137, 138) which serve as storage elements are disposed, and further to the individual storage elements, field-effect transistors 141, 142, 144, 145, 147, 148 for selecting elements to be read are connected. To the field-effect transistors 141, 144, 147, a sense line 151 is connected, and to the field-effect transistors 142, 145, 148, a sense line 152 is connected.

The sense line 151 is connected to a sense amplifier 153, and the sense line 152 is connected to a sense amplifier 154, so as to allow detection of information stored in the individual elements. On both ends of the write word line 111, bidirectional write-word-line current supply circuits 161, 162 are connected, and on both ends of the write word line 112, bidirectional write-word-line current drive circuits 163, 164 are connected. Moreover, on one end of the bit line 121 a bit-line current drive circuit 171 is connected, on one end of the bit line 122 a bit-line current drive circuit 172 is connected, and on one end of the bit line 123 a bit-line current drive circuit 173 is connected.

Next, a basic constitution of the magnetic storage device will be explained below. First, the tunnel magnetoresistance element (referred to as TMR element, hereinafter) which serves as a storage element of the memory cell will be explained referring to a perspective view in FIG. 6.

Figure 6:
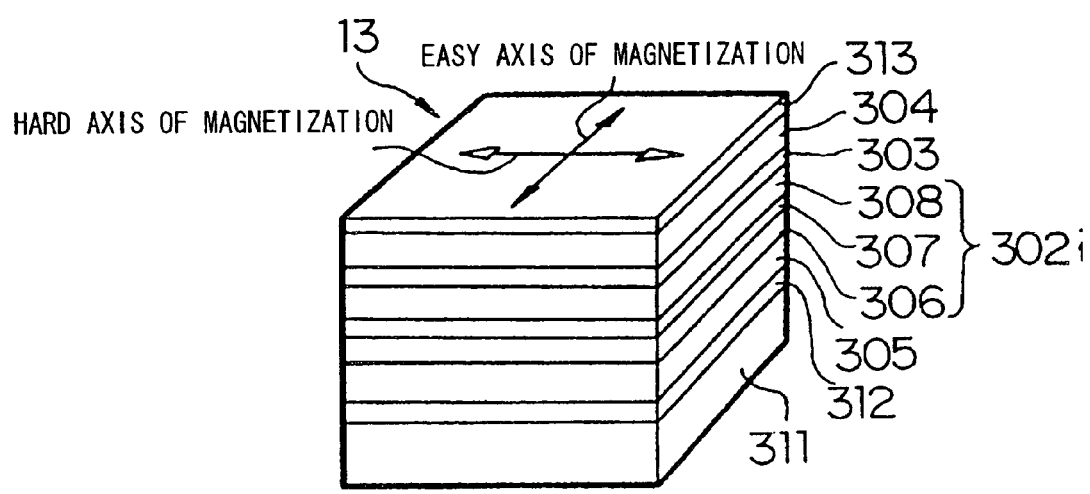
FIG. 6 is a perspective view showing a tunnel magnetoresistance element.

As shown in FIG. 6, the magnetic storage device (TMR element) 13 is basically configured so as to sandwich a tunnel insulating layer 303 with a magnetization fixed layer 302, which comprises a ferromagnetic material and has a fixed magnetization, and a storage layer 304, which comprises a ferromagnetic material and can readily rotates the magnetization.

In an exemplary case shown in FIG. 6, an underlying electrode layer 312 is formed on a support substrate 311, and further thereon an antiferromagnetic material layer 305 is formed. Further thereon, the above-mentioned magnetization fixed layer 302, the above-mentioned tunnel insulating layer 303 and the above-mentioned storage layer 304 are sequentially stacked. The magnetization fixed layer 302 further comprises a first magnetization fixed layer 306 and a second magnetization fixed layer 308, and between the first and second magnetization fixed layers 306, 308, a conductive material layer 307 such as allowing a magnetic layer to be coupled in an antiferromagnetic manner is disposed.

The above-mentioned underlying electrode layer 312 is used for connection with a switching element serially connected with the TMR element 13, and may be composed so as to function also as an antiferromagnetic material layer 305. In thus-configured cell, information is read out by detecting changes in tunnel current due to magnetoresistance effect, where effect thereof depends on a relative magnetization direction between the storage layer 304 and the magnetization fixed layer 302.

The above-mentioned storage layer 304, the above-mentioned first magnetization fixed layer 306 and the above-mentioned second magnetization fixed layer 308 are individually composed of a ferromagnetic material, and are typically composed of nickel, iron, cobalt, or an alloy composed of at least two elements selected from nickel, iron and cobalt.

The above-mentioned conductive material layer 307 is typically composed of ruthenium, copper, chromium, gold, silver or the like.

The first magnetization fixed layer 306 is formed so as to contact with the antiferromagnetic material layer 305, and has a strong unidirectional magnetic anisotropy due to exchange interaction exerted between these layers.

The above-mentioned antiferromagnetic material layer 305 is typically composed of iron-manganese alloy, nickel-manganese alloy, platinum-manganese alloy, iridium-manganese alloy, rhodium-manganese alloy, cobalt oxide, nickel oxide or the like.

The above-mentioned tunnel insulating layer 303 is typically composed of aluminum oxide, magnesium oxide, silicon oxide, aluminum nitride, magnesium nitride, silicon nitride, aluminum oxynitride, magnesium oxynitride or silicon oxynitride. The tunnel insulating layer 303 has a function of disconnecting magnetic coupling between the above-mentioned storage layer 304 and the above-mentioned magnetization fixed layer 302, and of allowing tunnel current to flow. These magnetic films and conductive material films are typically formed by the sputtering process. The tunnel insulating layer 303 can be obtained by oxidizing, nitrifying or oxidizing-nitrifying a metal film formed by the sputtering process.

Furthermore, on the uppermost layer, a top-coat film 313 is formed. The top-coat film 313 has a function of preventing inter-diffusion between the TMR element 13 and a wiring used for connecting other TMR element 13, reducing the contact resistance, and preventing oxidation of the storage layer 304. It is generally composed of a material such as tantalum nitride, tantalum, titanium nitride or the like. The underlying electrode layer 312 is used for connection with a switching element serially connected with the TMR element, and may be composed so as to function also as the above-mentioned antiferromagnetic material layer 305.

In thus-configured TMR element 13, information is read out by detecting changes in tunnel current based on magnetoresistance effect, where effect thereof depends on relative magnetization direction among the storage layer 304, and the first and second magnetization fixed layers 306, 308.

The above-mentioned magnetic layers and conductive material layers are typically formed by the sputtering process, ALD (atomic layer deposition) process or the like, and a tunnel barrier layer can be obtained also by oxidizing or nitrifying a metal film formed by the sputtering process as described in the above.

Figure 1:
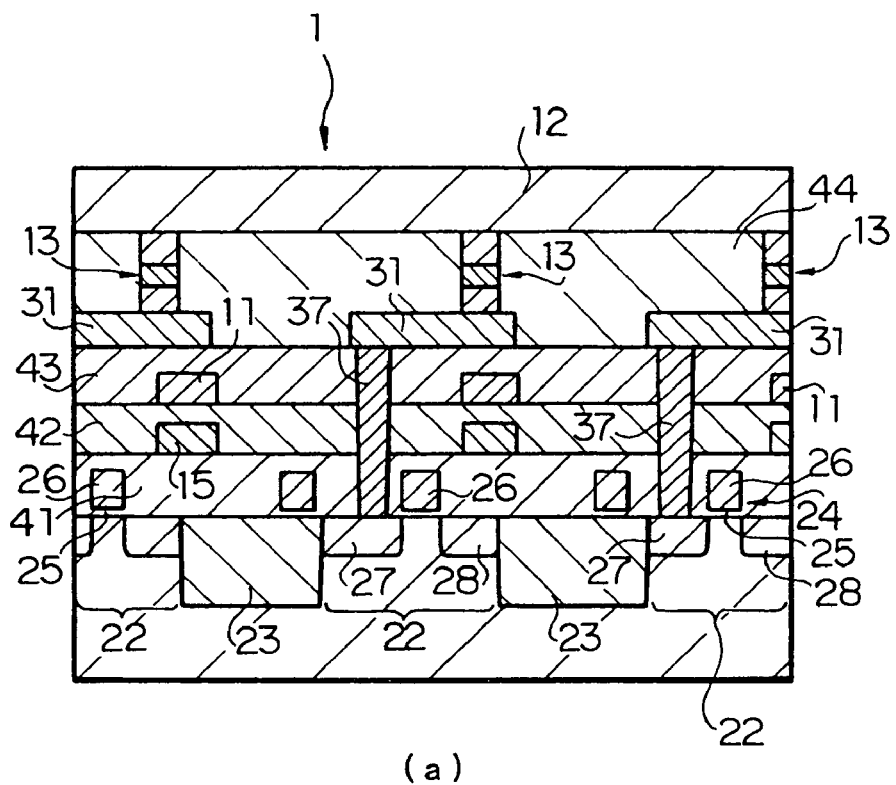
FIG. 1 is a schematic structural sectional view of one embodiment related to a magnetic storage device of the present invention.
Figure 1:
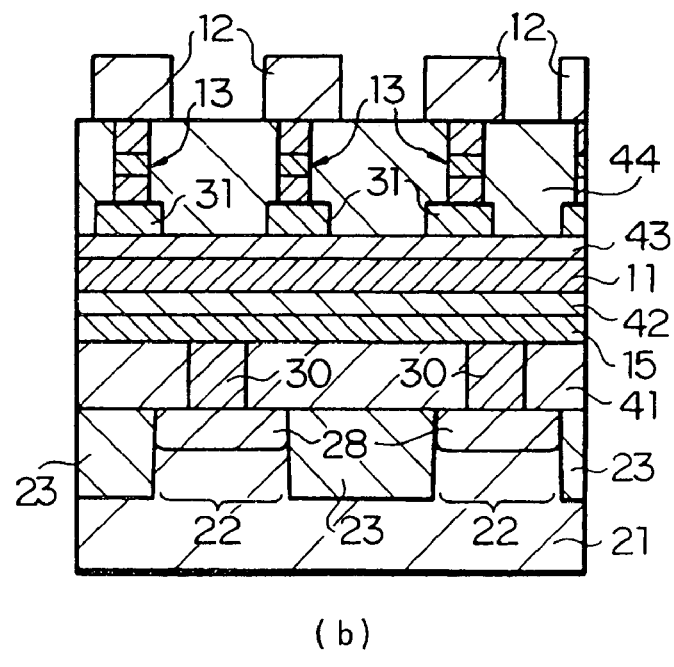
Figure 2A:
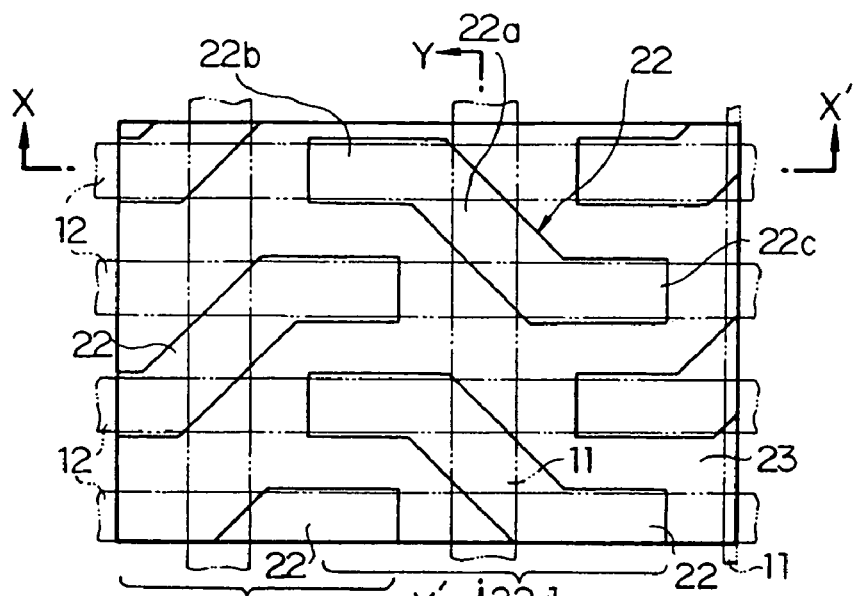
FIGS. 2A to 2C are layout drawings of principal layers showing one embodiment related to the magnetic storage device of the present invention.
Figure 2B:
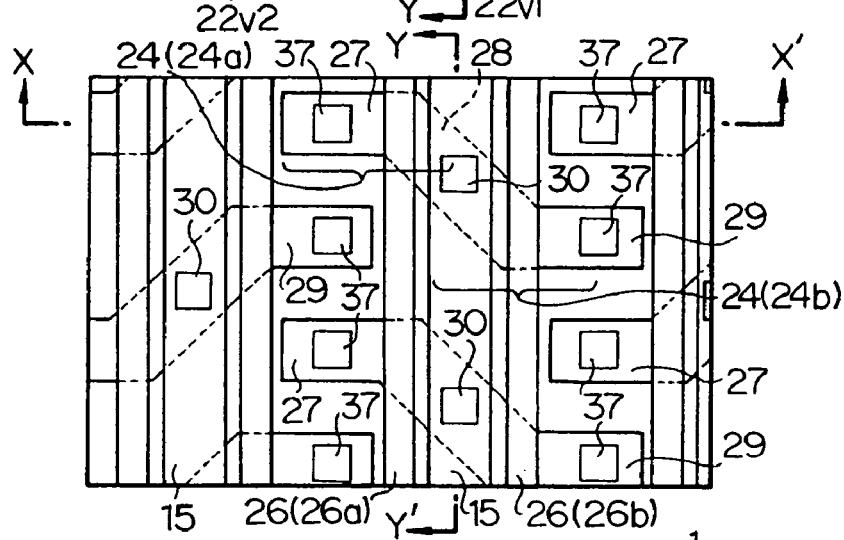
Figure 2C:
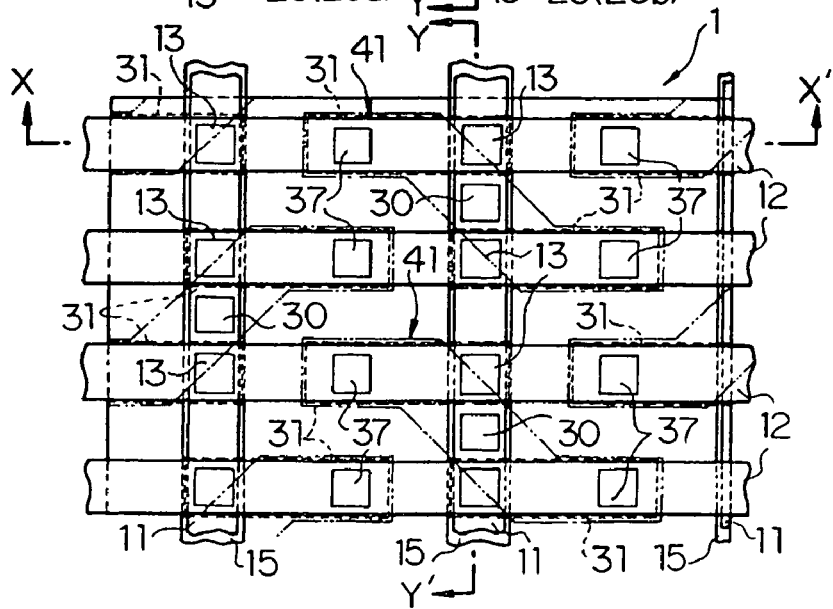

Next, one embodiment of the magnetic storage device of the present invention will be explained referring to FIG. 1 and FIGS. 2A to 2C. These drawings indicate the magnetic storage device having storage cells which are arranged so as to be shifted by ¼ pitches, where drawing (a) in FIG. 1 shows a sectional view taken along the line X–X' in the layout drawings shown in FIGS. 2A to 2B, and drawing (b) in FIG. 1 shows a sectional view taken along the line Y–Y' in the layout drawings shown in FIG. 2. Drawing A of FIG. 2 illustrates the semiconductor regions, FIG. 2B illustrates the read transistors, sense line and so forth, and FIG. 2C shows a layout drawing of write word lines, TMR elements, bit lines and so forth.

As seen in FIG. 1, on a top surface side of a semiconductor substrate (p-type semiconductor substrate, for example), a plurality of semiconductor regions 22 which are isolated by element isolation regions 23 and comprise p-type well regions are formed. The above-mentioned element isolation regions 23 are formed by so-called STI (shallow trench isolation) technology.

Each of the above-mentioned semiconductor regions 22 has two electrolysis-type transistors 24, 24 which serve as read transistors, and each of which comprises a first region 22a obliquely crosses a projected region on the semiconductor substrate 21 of the write word line 11 described later); a second region 22b formed in parallel with the bit line 12 so as to be continued from one end of the first region; and a third region 22c formed in parallel with the bit line 12 and so as to be continued from the other end of the first region 22a. Moreover, one end portion of each of a plurality of semiconductor regions 22 which compose a second semiconductor region array 22v2 adjacent to a first semiconductor region array 22v1 comprising a plurality of the semiconductor regions 22 arranged in the extending direction of the write word line 11 are arranged one by one between the individual semiconductor regions 22 in the first semiconductor region array 22v1 on the second semiconductor region array 22v2 side.

On each of the above-mentioned semiconductor regions 22 in the individual arrays arranged in a direction y in the drawing, two gate electrodes (read word line) 26(26a), 26(26b) are formed while being interposed by a gate insulating film 25, diffusion layer regions (N+ diffusion layer regions, for example) 27, 28 are formed in the semiconductor regions 22 on both sides of the gate electrode 26a, and diffusion layer regions (N+ diffusion layer regions, for example) 28, 29 are formed in the semiconductor regions 22 on both sides of the gate electrode 26b, so as to configure two field-effect transistors 24(24a), 24(24b). Incidentally, the diffusion layer region 28 is provided as a common diffusion layer region for the field-effect transistors 24a, 24b.

The above-mentioned field-effect transistors 24 function as switching elements for read operation. Besides n-type and p-type field-effect transistors, it is also allowable to use other various switching elements such as diodes and bipolar transistors.

A first insulating film 41 is formed so as to cover each of the above-mentioned field-effect transistors 24. As shown in the drawings, the surface of the first insulating film 41 is preferably planarized. In the first insulating film 41, contacts 30 for making contact to the above-mentioned diffusion layer region 28 are formed. On the first insulating film 41, sense lines (power supply lines) 15 connected to the contacts 30 are formed.

Further so as to cover the sense lines 15, a second insulating film 42 is formed. As shown in the drawings, the surface of the second insulating film 42 is preferably planarized. Further on the above-mentioned second insulating film 42, the write word lines 11 are formed so as to lie over the above-mentioned sense lines 15 and in parallel therewith.

On the above-mentioned second insulating film 42, a third insulating film 43 is formed so as to cover the above-mentioned write word lines 11. The surface of the third insulating film 43 is preferably planarized. In these third to first insulating films 43 to 41, contact portions 37 connected to the above-mentioned semiconductor regions 22 are arranged in parallel with the above-mentioned write word lines 11.

On the above-mentioned third insulating film 43, connection layers 31 are formed using an antiferromagnetic material layer 305 so as to extend from areas over the above-mentioned write word lines 11 and to be connected to the upper end portions of the above-mentioned contact portions 37. Further on the above-mentioned antiferromagnetic material layer 305 and over the above-mentioned write word lines 11, TMR elements 13 are formed. Each of the TMR elements 13 is configured, as previously explained referring to FIG. 6, by sequentially stacking, on the antiferromagnetic material layer 305, the magnetization fixed layer 302 having the first magnetization fixed layer 306, the conductive material layer 307 such as allowing a magnetic layer to be coupled in an antiferromagnetic manner and the second magnetization fixed layer 308; the tunnel insulating layer 303; the storage layer 304; and top-coat layer 313 in this order. Materials for composing the TMR element 13 are such as those previously explained referring to FIG. 6.

Storage cells 41 individually composed of the above-mentioned TMR element 13 and the above-mentioned connection layer 31 are disposed at the intersections of the individual write word lines 11 and the individual bit lines 12, where the individual storage cells 41 are arranged so as to be shifted by ½n (where, n represents a natural number of 1 or larger) pitches in an oblique direction away from the extending direction of the above-mentioned write word line 11.

On the above-mentioned third insulating film 43, a fourth insulating film 44 is formed so as to cover the above-mentioned antiferromagnetic material layer 305, the TMR elements 13 and the like. The top surface of the fourth insulating film 44 is planarized so as to expose the uppermost layer of the above-mentioned TMR elements 13. On the above-mentioned fourth insulating film 44, the bit lines 12 are formed so as to be connected to the upper surface of the above-mentioned TMR elements 13 and to three-dimensionally cross (at right angles for example) the above-mentioned write word lines 11 while placing the above-mentioned TMR elements 13 in between.

The above-mentioned write word lines 11, sense lines 15, bit lines 12 and the like can be formed using any materials available for semiconductor devices, where examples of which include aluminum, aluminum alloy, copper, copper alloy, conductive polysilicon; refractory metals such as tungsten, molybdenum, rhodium and nickel; and refractory metal suicides such as tungsten silicide and cobalt silicide.

In the above-mentioned magnetic storage device 1, each of the semiconductor regions 22 in which two field-effect transistors 24, 24, which serve as read transistors, comprises the first region 22a obliquely crosses the projected region of the write word line 11; the second region 22b formed in parallel with the bit line 12 so as to be continued from one end of the first region 22a; and the third region 22c formed in parallel with the bit line 12 and so as to be continued from the other end of the above-mentioned first region 22a, so that the storage cells 41, each of which comprises the TMR element 13 and the connection layer 31, can be arranged so as to be shifted by ½n (where, n represents a natural number of 1 or larger) pitches in an oblique direction away from the extending direction of the write word line, even if the TMR elements 13 are arranged in the intersectional regions of the bit lines 12 and write word lines 11, and so that the connection layers 31 are connected to the end portions of the semiconductor regions 22.

Moreover, this makes it possible to locate one end portion of each of a plurality of semiconductor regions 22, which compose the second semiconductor region array 22v2 adjacent to the first semiconductor region array 22v1 comprising a plurality of the semiconductor regions 22 arranged in the extending direction of the write word line 11, one by one between the individual semiconductor regions 22 in the first semiconductor region array 22v1 on the second semiconductor region array 22v2 side.

This makes it possible to isolate the semiconductor regions 22 in which the field effect transistors serving as the read transistors 24, 24 are to be made using the element isolation regions 23 in an effective manner, while avoiding waste in terms of occupied area. It is also made possible to reduce the cell area because the sense lines 15 and the write word lines 11 are stacked while placing the second insulating film 42 in between. It is still also possible to solve a problem of cross-talk because the distance between the TMR elements 13 and between the write word lines 11 can be ensured to a sufficient level.

Next, the method of fabricating the semiconductor device of the present invention will be explained referring to sectional views showing process steps, layout drawings and the like in FIG. 7A to 11C. In these drawings, FIGS. 7A to 11A show the layout drawings, FIGS. 7B to 11B show sectional views taken along the line X–X' in FIGS. 7A to 11A, and FIGS. 7C to 11C show sectional views taken along the line Y–Y' in FIGS. 7A to 11A. The method of fabrication described herein is such as fabricating a magnetic storage device in which storage cells are arranged to be shifted by ½n pitches.

Figure 7A:
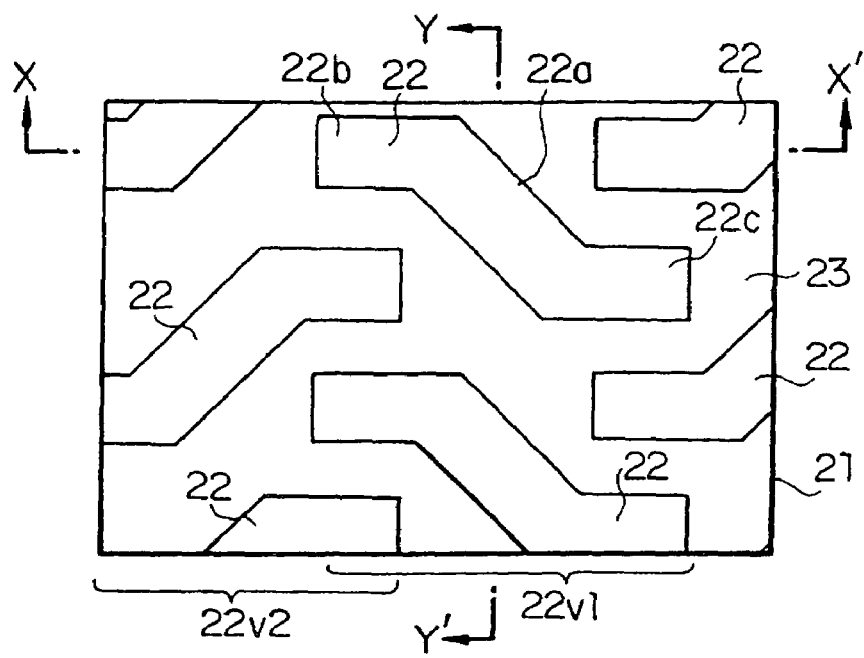
FIGS. 7A to 7C are schematic structural sectional views and a layout diagram of one embodiment related to a method of fabricating the magnetic storage device of the present invention.
Figure 7B:
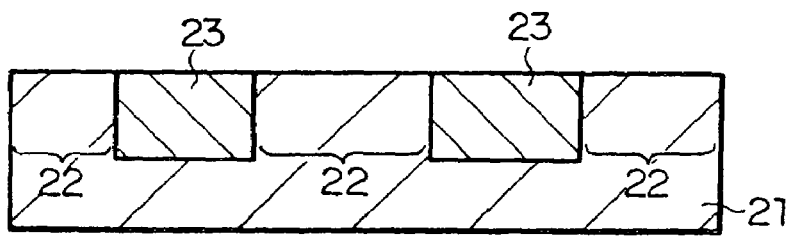
Figure 7C:
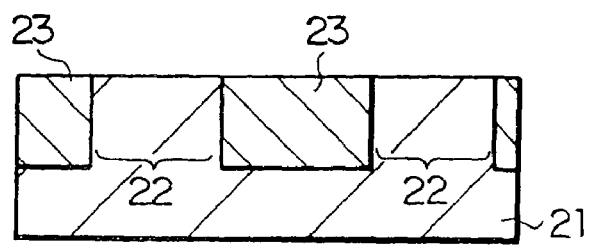

As shown in FIGS. 7A to 7C, the element isolation regions 23 are formed in the semiconductor substrate 21 typically by the STI (shallow trench isolation) technology so as to isolate the semiconductor regions 22 in each of which two read transistors are to be formed. Each of the semiconductor regions 22 typically comprises the first region 22a obliquely crosses a projected region of an expected region (indicated by two-dot chain line) in which the write word line will be formed later; the second region 22b formed in parallel with the bit line which will be formed later, and so as to be continued from one end of the above-mentioned first region 22a; and the third region 22c formed in parallel with the bit line and so as to be continued from the other end of the above-mentioned first region 22a.

Moreover, one end portion of each of a plurality of semiconductor regions 22 which compose a second semiconductor region array 22v2 adjacent to a first semiconductor region array 22v1 comprising a plurality of the semiconductor regions 22 arranged in the extending direction of the write word line 11 are arranged one by one between the above-mentioned individual semiconductor regions 22 in the first semiconductor region array 22v1 on the second semiconductor region array 22v2 side.

Figure 8A:
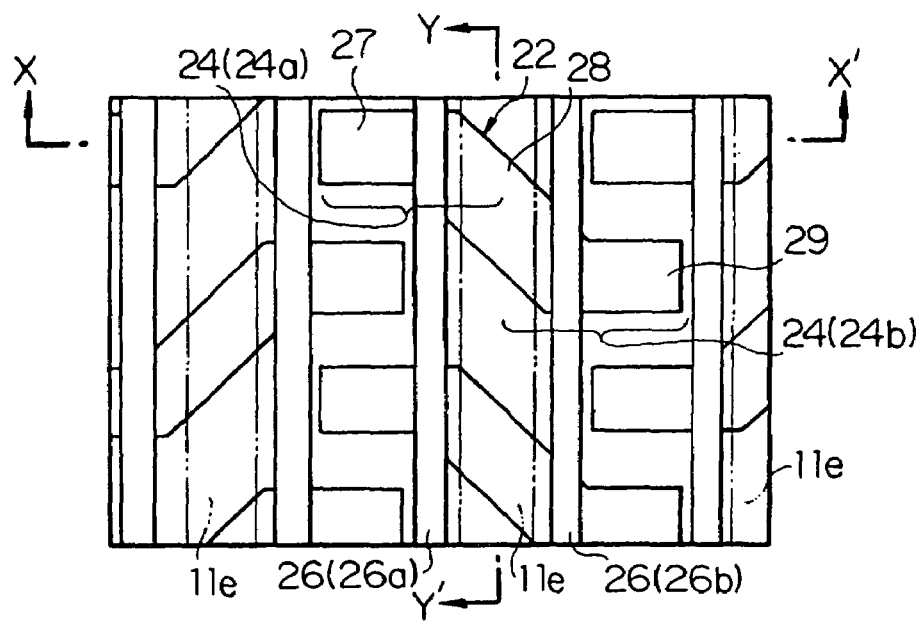
FIGS. 8A to 8C are schematic structural sectional views and a layout diagram of one embodiment related to the method of fabricating the magnetic storage device of the present invention.
Figure 8B:
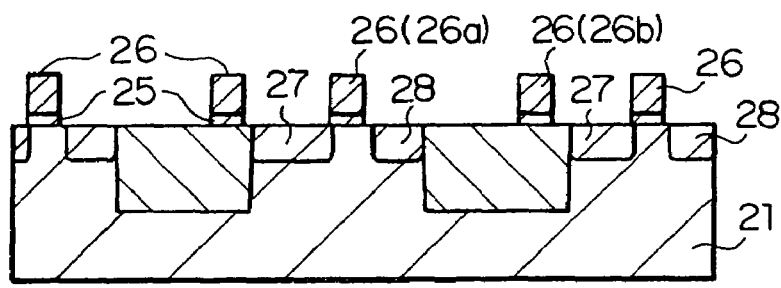
Figure 8C:
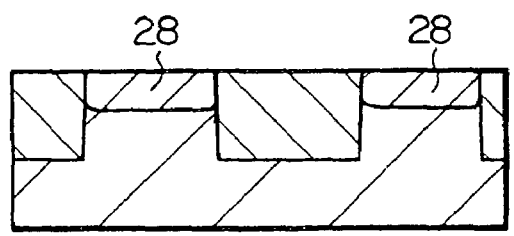

Next, as shown in FIGS. 8A to 8C, the gate electrodes 26(26a), 26(26b) are formed on the semiconductor regions 22 while placing the gate insulating film 25 in between on both sides of, and in parallel with, an expected region 11e in which the above-mentioned write word line will be formed later, according to general techniques for fabricating insulated-gate, field-effect transistors. The diffusion layers 27, 28, 29 are then formed in the semiconductor regions 22 on both sides of two gate electrodes 26, 26. Among these, the diffusion layer 28 formed in the first region 22a between the gate electrodes 26, 26 serves as a common diffusion layer for two read transistors. Thus the field-effect transistors 24(24a), 24(24b), which are two read transistors, are formed in the semiconductor regions 22.

Figure 9A:
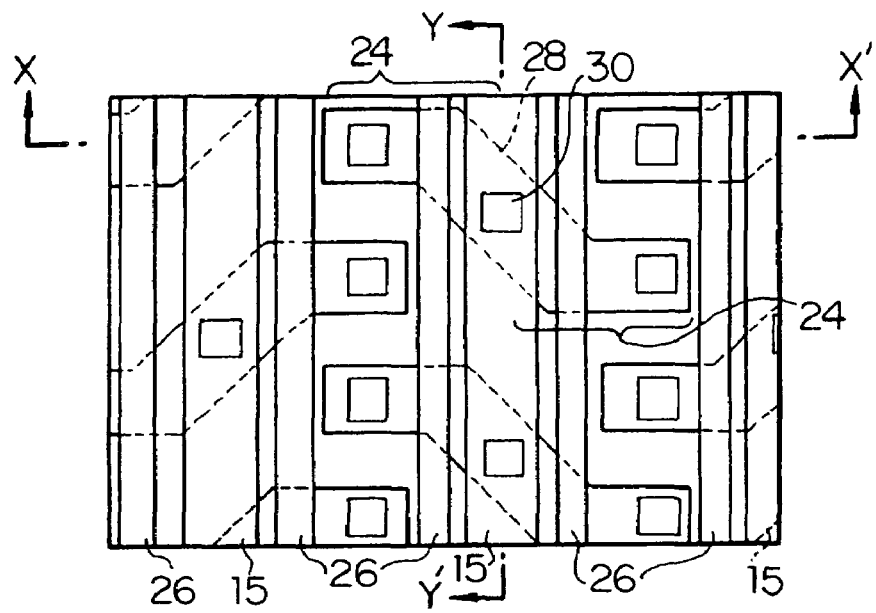
FIGS. 9A to 9C are schematic structural sectional views and a layout diagram of one embodiment related to the method of fabricating the magnetic storage device of the present invention.
Figure 9B:
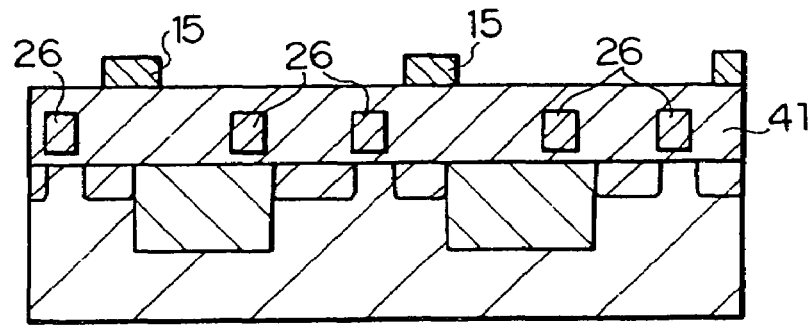
Figure 9C:
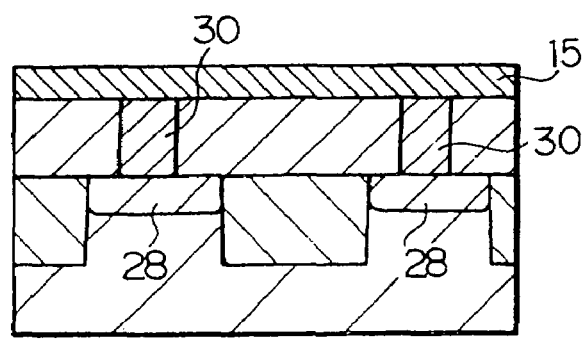
Figure 11A:
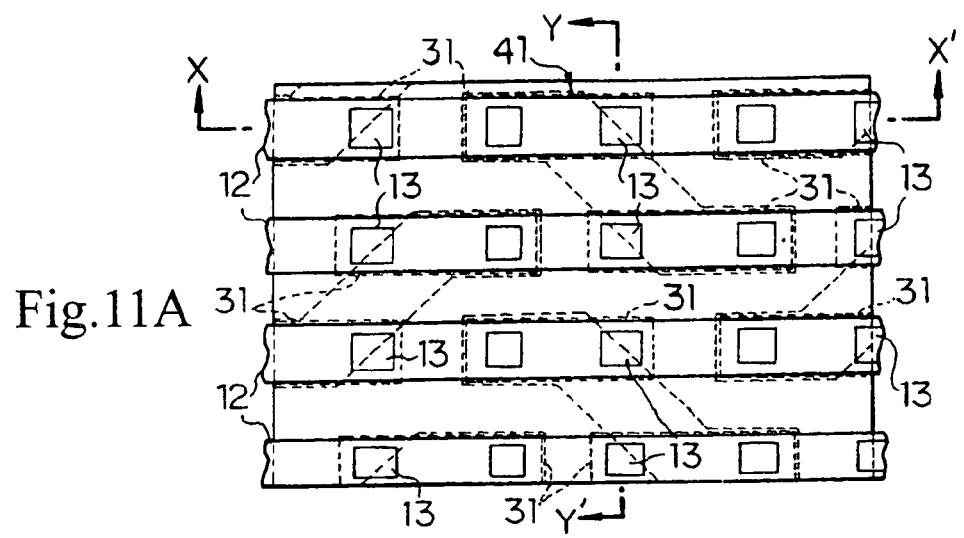
FIGS. 11A to 11C are schematic structural sectional views and a layout diagram of one embodiment related to the method of fabricating the magnetic storage device of the present invention.
Figure 11B:
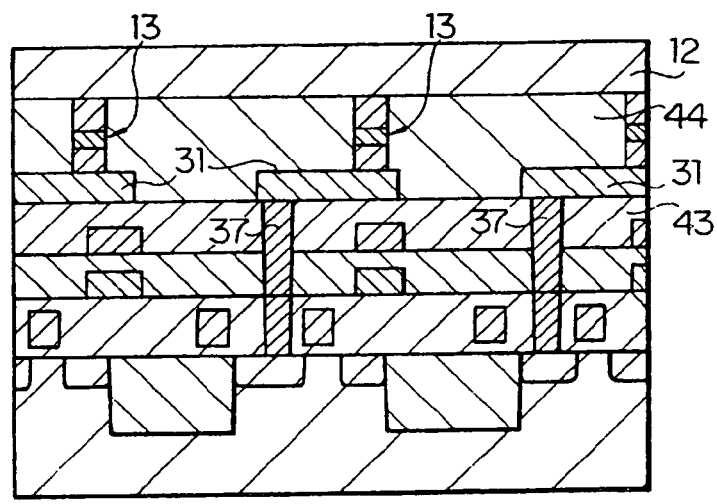
Figure 11C:
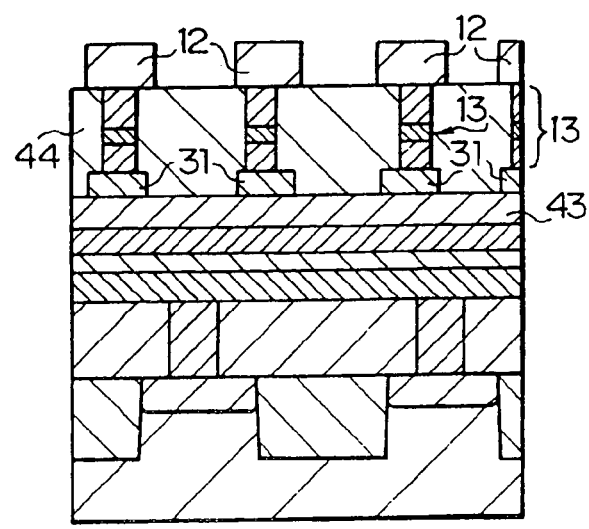

Next, as shown in FIGS. 9A to 9C, the first insulating film 41 is formed on the semiconductor substrate 21 so as to cover the field-effect transistors 24 which serve as the above-mentioned read transistors, using a technique for depositing insulating films such as the chemical vapor deposition process. The surface of the first insulating film 41 is preferably planarized by a planarization technique such as chemical mechanical polishing while keeping the gate electrodes 26 not exposed.

Next, after the contacts 30 to be connected to the common diffusion layers 28 of the individual field-effect transistors 24 which serves as the above-mentioned read transistors are formed in the above-mentioned first insulating film 41, on the above-mentioned first insulating film 41, the sense lines (power supply lines) 15 are formed so as to be connected with the above-mentioned contacts 30 in parallel with the expected regions in which the write word lines are formed later. Methods for forming the sense lines 15 may be similar to those in general wiring formation, where, for example, after a conductive material film is formed on the first insulating film 41, the above-mentioned conductive material film is patterned to obtain a predetermined wiring form using lithography, etching techniques, or the like.

Furthermore, as shown in FIGS. 10A to 10C, the second insulating film 42 which covers the above-mentioned sense lines 15 is formed on the above-mentioned first insulating film 41 using silicon oxide or aluminum oxide according to a technique for depositing insulating films such as the chemical vapor deposition process. The surface of the second insulating film 42 is preferably planarized typically by a planarization technique such as chemical mechanical polishing, so as to leave the film in a thickness of 700 nm or around on the sense lines 15.

On the aforementioned second insulating film 42, the write word lines 11 for applying a magnetic field to the TMR elements which will be formed later are formed along the above-mentioned sense lines 15. Methods for forming the write word lines 11 may be similar to those in general wiring formation, where, for example, after a conductive material film is formed on the second insulating film 42, the above-mentioned conductive material film is patterned to obtain a predetermined wiring form using lithography, etching techniques or the like.

In a possible method for forming the write word lines 11 over the sense lines 15 by a lithographic technique without causing misalignment, the above-mentioned contact portions (not shown) are formed first, a conductive material film for forming the sense lines is formed on the first insulating film 41, the second insulating film 42 is formed, and a conductive material film for forming the write word lines 11 is formed. Thereafter, the second insulating film 42 and two conductive material films sandwiching the insulating film are then patterned to obtain a predetermined form of the write word lines using lithography and etching techniques, to thereby successfully form the write word lines 11 and the sense lines 15 stacked with each other while placing the second insulating film 42 in between.

Next, the third insulating film 42 is formed so as to cover the above-mentioned write word lines 11. The surface of the third insulating film 43 is preferably planarized by a planarization technique such as chemical mechanical polishing.

It is to be noted that for s case where the write word lines 11 and the sense lines 15 are concomitantly patterned, the above-mentioned third insulating film 43 is formed on the above-mentioned first insulating film 41 so as to cover the write word lines 11 and the sense lines 15.

In other method, a P-TEOS (plasma tetra-ethoxysilane) film of 100 nm thick, an HDP (high density plasma CVD) film of 800 nm thick and a P-TEOS film of 1200 nm thick are sequentially deposited on the above-mentioned sense lines 15, and are then planarized by chemical mechanical polishing so as to leave the second insulating film 42 in a thickness of 700 nm on the sense lines 15. Then a P-SiN (plasma silicon nitride) film is deposited to a thickness of 20 nm, and via holes (not shown) are formed in the film by photolithography and etching techniques. Then a P-TEOS film is deposited to a thickness of 300 nm, and the interlayer silicon oxide film is etched using a photoresist as a mask under a condition where a large $SiO_2$/P-SiN etching selection ratio can be ensured, so as to concomitantly form the via holes and wiring grooves in which the write word lines to be formed. Next, a barrier layer (e.g., a Ti film of 5 nm thick and a TiN film of 20 nm thick as viewed from the bottom) is formed on an inner surface of the via holes and the wiring grooves by the PVD (physical vapor deposition) process, and the via holes and the wiring grooves are then filled with a tungsten film by the CVD process. Thereafter, the excessive portion of the tungsten film on the silicon oxide film is removed to thereby form the write word lines 11 and the contact portions (not shown) connected thereto. A P-TEOS film is then deposited to a thickness of 100 nm for example, to thereby form the third insulating film 43 on the above-mentioned second insulating film. The surface of the third insulating film 43 is desirably planarized because the P-TEOS film deposited to as thick as 100 nm is formed on the planarized surface.

Although the tungsten deposited by the chemical vapor deposition process was used in the above exemplary process for fabricating the write word lines 11 based on the groove wiring technique, it is also allowable to form them by depositing iridium, osmium, chromium, zirconium, tungsten, tantalum, titanium thorium, vanadium, molybdenum, rhodium, nickel, ruthenium or alloys thereof by sputtering or the chemical vapor deposition process.

The write word line may partially be thinned around a portion directly under the TMR in order to raise the resistivity, or may be planarized for more efficient heat dissipation.

Next, the contact portions 37 penetrating from the above-mentioned third insulating film 43 through the above-mentioned first insulating film 41 are formed so as to make contact to each of two diffusion layers 27, 29 other than the common diffusion layer 28 composing the above-mentioned two field-effect transistors 24, 24 which serve as read transistors. The above-mentioned contact portions 37 herein are formed to be arranged in parallel with the above-mentioned write word lines 11.

Next, as shown in FIG. 11, the material layers composing the TMR elements 13, previously explained referring to FIG. 6, are deposited typically by the PVD process.

For example, the underlying electrode layer 312 is formed, and the antiferromagnetic material layer 305 is formed thereon. Further thereon, the above-mentioned magnetization fixed layer 302, the above-mentioned tunnel insulating layer 303 and the above-mentioned storage layer 304 are sequentially stacked. The magnetization fixed layer 302 is formed by stacking the first magnetization fixed layer 306, the conductive material layer 307 such as allowing a magnetic layer to be coupled in an antiferromagnetic manner, and the second magnetization fixed layer 308 in this order from the bottom.

For example, material layers for forming the aforementioned individual layers are stacked, and the stacked film is then processed by reactive ion etching technique using a photoresist mask to thereby form the TMR elements 13. The etching proceeds from the tunnel insulating layer 303 which comprises an aluminum oxide film and ends in midway of the lowermost antiferromagnetic layer 305. Etching gas available herein is a chlorine-containing halogen gas, or a gas system added with carbon monoxide (CO) or ammonia ($NH_3$), or the like. Next, using a photoresist mask, the residual stacked film is processed by reactive ion etching, to thereby form the connection layers 31 for connecting the TMR elements 13 and the contact portions 37, using a part of the above-mentioned stacked film.

In the above-mentioned TMR element, as an example, the underlying electrode layer 312 is used for connection with a switching element serially connected with the TMR element 13, and is composed using titanium nitride, tantalum, tantalum nitride or the like. The antiferromagnetic material layer 305 is typically, for example, composed of iron-manganese alloy, nickel-manganese alloy, platinum-manganese alloy, iridium-manganese alloy, rhodium-manganese alloy, cobalt oxide, nickel oxide or the like. It is also allowable for the antiferromagnetic material layer 305 to serve as the underlying electrode layer 312.

The first magnetization fixed layer 306 is formed so as to contact with the antiferromagnetic material layer 305, and has a strong unidirectional magnetic anisotropy based on exchange interaction exerted between these layers.

The tunnel insulating layer 303 is typically composed of aluminum oxide, magnesium oxide, silicon oxide, aluminum nitride, magnesium nitride, silicon nitride, aluminum oxynitride, magnesium oxynitride or silicon oxynitride. The thickness thereof is extremely as thin as 0.5 nm to 5 nm. Therefore, it is formed by the ALD (atomic layer deposition) process, or by depositing aluminum by sputtering and then oxidizing it in plasma. The tunnel insulating layer 303 has a function of disconnecting magnetic coupling between the storage layer 304 and the magnetization fixed layer 302, and of allowing tunnel current to flow.

The above-mentioned storage layer 304 and the above-mentioned first and second magnetization fixed layers 306, 308 are composed of ferromagnetic materials, and are formed typically using nickel, iron or cobalt, or an alloy composed of at least any two of nickel, iron and cobalt. The thickness of the above-mentioned first and second magnetization fixed layers 306, 308 are generally set to 0.5 nm to 5 nm. The conductive material layer 307 is formed using ruthenium, copper, chromium, gold, silver or the like. It is possible to change the direction of magnetization of this layer parallel to or antiparallel to that of the underlying ferromagnetic material layer upon being applied with an external magnetic field.

These magnetic films and conductive films are formed mainly by the sputtering process or the ALD process. They can be formed also by oxidizing, nitrifying or oxidizing-nitrifying a metal film formed by the sputtering process.

On the uppermost layer, a top-coat film 313 is formed. The top-coat film 313 has a function of preventing inter-diffusion between the TMR element 13 and a wiring used for connecting other TMR element 13, reducing the contact resistance, and preventing oxidation of the storage layer 304. It is generally composed of a material such as tantalum nitride, tantalum, titanium nitride or the like.

The connection layer 31 including the underlying electrode layer 312 is used for connection with the field-effect transistor 24 which is a read transistor serving as a switching element serially connected to the TMR element 13, and may be composed so as to function also as the above-mentioned antiferromagnetic material layer 305.

Moreover, as shown in the drawings, when a plurality of storage cells 41 composed of thus-configured TMR elements 13 and the above-mentioned connection layers 31 are formed, the plurality of storage cells are arranged so as to be shifted by ½n (where, n represents a natural number of 1 or larger) pitches in an oblique direction away from the extending direction of the write word lines 11.

Next, on the above-mentioned third insulating film 43, the fourth insulating film 44 is formed typically by the chemical vapor deposition process so as to cover the above-mentioned TMR elements 13. The fourth insulating film 44 is first formed by depositing an insulating film such as being composed of silicon oxide or aluminum oxide or the like over the entire surface typically by the CVD or PVD process, and is then planarized typically by chemical mechanical polishing so as to make the top-coat films 313 of the TMR elements 13 exposed.

Then according to the standardized wiring formation techniques, the bit lines 12 and other wirings for peripheral circuits (not shown) are formed. The above-mentioned bit lines 12 are formed so as to be connected to the above-mentioned TMR elements 13 and to cross with a right angle to the above-mentioned write word lines 11.

Next, a plasma silicon nitride (P-SiN) film (not shown) is deposited typically by the chemical vapor deposition process over the entire surface, and openings are made at the portions for forming bonding pads, to thereby complete the LSI wafer process.

In the aforementioned fabrication method, because the semiconductor region 22 in which two read transistors 24, 24 are formed comprises the first region 22*a* obliquely crosses a projected region of the write word line 11; the second region 22*b* formed in parallel with the bit line 12 so as to be continued from one end of the first region 22*a*; and the third region 22*c* formed in parallel with the bit line 12 so as to be continued from the other end of the first region 22*a*, the storage cells 41 which individually comprise the TMR element 13 and connection layer 31 can be arranged so as to be shifted by ½n (where, n represents a natural number of 1 or larger) pitches in an oblique direction away from the extending direction of the write word line 11, even when the cell is designed so that the TMR element 13 is arranged in the intersectional region of the bit line 12 and write word line 11, and so that the connection layer 31 is connected to the end portion of the semiconductor region 22.

Moreover, this makes it possible to locate one end portion of each of a plurality of semiconductor regions 22, which compose a second semiconductor region array 22*v*2 adjacent to a first semiconductor region array 22*v*1 comprising a plurality of the semiconductor regions 22 arranged in the extending direction of the write word line 11, one by one between the individual semiconductor regions 22 in the first semiconductor region array 22*v*1 on the second semiconductor region array 22*v*2 side. This makes it possible to effectively layout the semiconductor regions 22 in which the read transistors 24 are to be made while avoiding waste in terms of occupied area.

It is also made possible to reduce the cell area because the sense lines 15 and write word lines 11 are stacked while placing the second insulating film 42 in between. It is still also possible to solve a problem of cross-talk because the distance between the TMR elements 13 and between the write word lines 11 can be ensured to a sufficient level.

INDUSTRIAL APPLICABILITY

The magnetic storage device and the method of fabricating the same according to the present invention makes it possible to effectively layout the individual semiconductor regions in which the read transistors are to be made while avoiding waste in terms of occupied area. Also the structure in which the sense lines and the write word lines are stacked while placing the second insulating film in between can successfully reduce the cell area. In addition, it is still also possible to solve a problem of cross-talk because the distance between the TMR elements and between the write word lines can be ensured to a sufficient level. Accordingly the present invention is successful in providing an MRAM (magnetic random access memory) capable of achieving high reliability and high speed.

The invention claimed is:

1. A magnetic random access memory device comprising:
a plurality of write word lines;
a plurality of bit lines formed so as to cross said write lines forming intersectional regions, said plurality of bit lines formed at a predetermined distance from the plurality of write word lines; and
a plurality of storage cells disposed substantially in the intersectional regions, each comprising a magnetic storage element and a connection layer; the magnetic storage element comprising an insulating layer sandwiched by ferromagnetic layers, and the connection layer formed between the magnetic storage element and one of the plurality of write word lines, the connection layer comprising an anti-ferromagnetic material layer formed on a side of the one of the plurality of write word lines and characterized by having a semiconductor region in which two read transistors are formed, and which comprises a first region, which obliquely crosses a projected region of said write line; a second region formed in parallel with a first crossing bit line at the intersectional region so as to be continued from one end of said first region; and a third region formed in parallel with a second bit line so as to be continued from the other end of said intersectional region;

wherein the plurality of storage cells are arranged to be shifted by ½n (where, n represents a natural number of 1 or larger) pitches in an oblique direction away from an extending direction of the write word lines; and wherein a first semiconductor region array comprising a plurality of semiconductor regions arranged in the extending direction of the plurality of write word lines is arranged one by one between individual semiconductor regions on a side of a second semiconductor region array adjacent to the first semiconductor region array.

* * * * *